(12) United States Patent
Krivokapic et al.

(10) Patent No.: US 6,596,598 B1
(45) Date of Patent: Jul. 22, 2003

(54) T-SHAPED GATE DEVICE AND METHOD FOR MAKING

(75) Inventors: Zoran Krivokapic, Santa Clara, CA (US); Shekhar Pramanick, Fremont, CA (US); Sunny Cherian, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/510,813

(22) Filed: Feb. 23, 2000

(51) Int. Cl.[7] .............................................. H01L 21/336
(52) U.S. Cl. ..................... 438/301; 438/301; 438/302; 438/304; 438/305; 438/653; 438/656; 438/673
(58) Field of Search .................................... 438/585, 592, 438/666, 163, 172, 176, 182, 185, 191, 215, 217, 232, 235, 296, 302, 305, 306, 419, 420, 421, 422, 524, 525, 527, 537, 542, 574, 579, 582, 595, 596, 653, 654, 655, 656, 657, 661, 664, 684, 685; 257/388, 344, 382

(56) References Cited

U.S. PATENT DOCUMENTS

| | | | |
|---|---|---|---|
| 4,679,311 A | 7/1987 | Lakhani et al. ............... 29/579 |
| 5,115,290 A | * 5/1992 | Murakami et al. ........ 357/23.9 |
| 5,155,054 A | 10/1992 | Itoh ............................ 437/41 |
| 5,212,106 A | 5/1993 | Erb et al. ..................... 437/45 |
| 5,256,894 A | * 10/1993 | Shino ....................... 257/388 |
| 5,304,511 A | 4/1994 | Sakai ......................... 437/203 |
| 5,358,885 A | 10/1994 | Oku et al. ................... 437/39 |
| 5,436,489 A | 7/1995 | Murase ...................... 257/401 |
| 5,496,748 A | * 3/1996 | Hattori et al. ................ 437/40 |
| 5,496,779 A | 3/1996 | Lee et al. .................... 437/40 |
| 5,543,646 A | * 8/1996 | Satoh et al. ................ 257/344 |
| 5,554,544 A | * 9/1996 | Hsu ............................ 437/35 |
| 5,556,525 A | 9/1996 | Krivokapic et al. ... 204/192.12 |

(List continued on next page.)

FOREIGN PATENT DOCUMENTS

JP    08-264531    * 10/1996

*Primary Examiner*—George Fourson
*Assistant Examiner*—Julio J. Maldonado
(74) *Attorney, Agent, or Firm*—Renner, Otto, Boisselle & Sklar, LLP

(57) ABSTRACT

A semiconductor device includes a T-shaped gate electrode. The T-shaped electrode may have a metal upper layer and a semiconductor lower layer with a diffusion barrier therebetween. The metal upper layer may be used as a gate mask to control implantation of ions in a semiconductor substrate. Gate metal-semiconductor portions may be electrically coupled to both the metal upper portion and the semiconductor lower portion thereby to reduce electrical resistance in the T-shaped electrode. A method of forming source and drain regions in the semiconductor device includes using the T-shaped gate electrode as an implant mask.

24 Claims, 8 Drawing Sheets

U.S. PATENT DOCUMENTS

| | | | | |
|---|---|---|---|---|
| 5,559,049 A | * | 9/1996 | Cho | 437/44 |
| 5,559,357 A | | 9/1996 | Krivokapic | 257/336 |
| 5,571,738 A | | 11/1996 | Krivokapic | 437/44 |
| 5,580,428 A | | 12/1996 | Krivokapic et al. | 204/192.12 |
| 5,601,954 A | | 2/1997 | Krivokapic et al. | 430/5 |
| 5,643,428 A | | 7/1997 | Krivokapic et al. | 204/298.11 |
| 5,646,870 A | | 7/1997 | Krivokapic et al. | 364/578 |
| 5,650,342 A | * | 7/1997 | Satoh et al. | 437/36 |
| 5,655,110 A | | 8/1997 | Krivokapic et al. | 395/500 |
| 5,741,736 A | * | 4/1998 | Orlowski et al. | 438/286 |
| 5,817,558 A | | 10/1998 | Wu | 438/291 |
| 5,824,587 A | | 10/1998 | Krivokapic | 438/300 |
| 5,869,374 A | | 2/1999 | Wu | 438/291 |
| 5,879,998 A | | 3/1999 | Krivokapic | 438/300 |
| 5,888,873 A | | 3/1999 | Krivokapic | 438/307 |
| 5,915,185 A | | 6/1999 | Fratin et al. | 438/202 |
| 5,928,813 A | | 7/1999 | Krivokapic et al. | 430/5 |
| 5,955,759 A | | 9/1999 | Ismail et al. | 257/332 |
| 5,972,761 A | | 10/1999 | Wu | 438/305 |
| 5,998,290 A | * | 12/1999 | Wu et al. | 438/595 |
| 6,013,570 A | * | 1/2000 | Yu et al. | 438/595 |
| 6,018,185 A | * | 1/2000 | Mitani et al. | 257/374 |
| 6,093,628 A | * | 7/2000 | Lim et al. | 438/592 |
| 6,124,177 A | * | 9/2000 | Lin et al. | 438/305 |
| 6,218,252 B1 | * | 4/2001 | Yeo | 438/305 |
| 6,251,737 B1 | * | 6/2001 | Lee | 438/307 |
| 2001/0001724 A1 | * | 5/2001 | Kwok et al. | 438/585 |

* cited by examiner

T-SHAPED GATE DEVICE AND METHOD FOR MAKING

BACKGROUND OF THE INVENTION

1. Field of the Invention

The invention involves semiconductor devices and methods for fabricating the same. In particular, the invention involves semiconductor devices having metal oxide semiconductor field effect transistors (MOSFETS) and methods of manufacturing such devices.

2. Description of the Related Art

Increased performance requirements have led to integrated circuits with denser arrays of devices, necessitating for example smaller gate sizes. As gate sizes decrease, forming electrical contacts with gate electrodes becomes an increasingly difficult problem.

In addition, another difficulty in the manufacture of semiconductor devices involves the doping of semiconductor substrate layers with electrically-active materials, in order to form electrically-conductive regions such as source and drain regions in the vicinity of a gate, for example in forming a metal oxide semiconductor field effect transistor (MOSFET). In the creation of such electrically-conductive regions, it is desirable for a shallow, relatively lightly-doped channel or extension region to be closest to the gate. Therefore the doping to create source and drain regions may involve multiple steps: an initial light doping, formation of a mask layer to protect the channels or extensions from further doping, a higher-energy doping to create the main source and drain regions, and finally removal of the mask layer.

From the foregoing, it will be appreciated that it would be desirable to provide simple means for making electrical connections with gate electrodes.

In addition, it will be appreciated that it would be desirable to simplify the procedures for implantation to create source and drain regions.

SUMMARY OF THE INVENTION

A semiconductor device includes a T-shaped gate electrode. The T-shaped electrode may have a metal upper layer and a semiconductor lower layer with a diffusion barrier therebetween. The metal upper layer may be used as a gate mask to control implantation of ions in a semiconductor substrate. Gate metal-semiconductor portions may be electrically coupled to both the metal upper portion and the semiconductor lower portion thereby to reduce electrical resistance in the T-shaped electrode. A method of forming source and drain regions in the semiconductor device includes using the T-shaped gate electrode as an implant mask.

According to an aspect of the invention, a semiconductor device has a T-shaped gate electrode with a tungsten top layer.

According to another aspect of the invention, a semiconductor device has a T-shaped gate electrode, the T-shaped gate electrode having a metal upper portion, a semiconductor lower portion, and a gate metal-semiconductor portion electrically coupled both to the upper portion and the lower portion.

According to yet another aspect of the invention, a semiconductor device has a gate electrode which includes a metal portion and a metal-semiconductor portion electrically coupled to the metal portion, the metal of the metal portion being a different metal than the metal of the metal-semiconductor portion.

According to still another aspect of the invention, a semiconductor device has a T-shaped electrode used as an implant mask.

According to a further aspect of the invention, a semiconductor device has a gate electrode which has a metal portion used as an implant mask.

According to a still further aspect of the invention, a method of forming source and drain regions in a semiconductor substrate includes forming deep implant regions using a perpendicular implant, and forming extensions or channels using one or more tilted implants.

According to another aspect of the invention, a method of forming source and drain regions in a semiconductor substrate includes using a gate electrode as an implant mask during the formation of deep implant regions.

According to yet another aspect of the invention, a method for fabricating a semiconductor device includes the steps of forming a T-shaped gate electrode over a semiconductor substrate, the gate electrode having a metal upper portion which overhangs a conductive lower portion; and selectively implanting an exposed surface of the substrate, using the metal upper portion as an implant mask.

According to still another aspect of the invention, a semiconductor device includes a T-shaped gate electrode having a lower conductive portion and an upper conductive portion with overhangs that overhang the lower portion, the upper portion including tungsten.

According to a further aspect of the invention, a semiconductor device includes a gate electrode having a lower semiconductor portion, an upper metal portion, a diffusion barrier between the lower portion and the upper portion, and a metal-semiconductor portion electrically coupled to the lower portion and the upper portion.

According to a still further aspect of the invention, a method of fabricating a semiconductor device includes the steps of forming a gate electrode over a semiconductor substrate, the gate electrode having a metal upper portion and a semiconductor lower portion; and forming a metal-semiconductor portion on the gate electrode which is electrically coupled to the lower portion and the upper portion.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A semiconductor device includes a T-shaped gate which has a metal upper portion and a non-metal conductive lower portion. The metal upper portion may be used as an implant mask when implanting the semiconductor substrate upon which the T-shaped gate is formed. In particular, the metal upper portion may be used as a mask in one or more implants of the semiconductor substrate to form source and drain regions with extensions. A metal-semiconductor compound portion may be formed on the T-shaped gate to improve conductivity between the metal upper portion and the non-metal lower portion.

Figure 1:
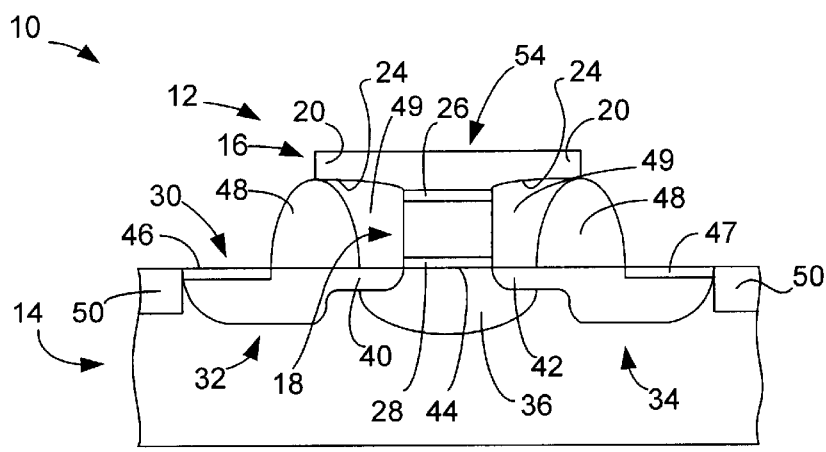
FIG. 1 is a side sectional view of a semiconductor device embodying the present invention.

Referring initially to FIG. 1, a semiconductor device 10 includes a gate electrode 12 atop a semiconductor substrate 14. The gate electrode 12 includes an upper portion 16 and a lower portion 18. The gate electrode 12 is T-shaped, with the upper portion 16 having overhangs 20 which extend past the lower portion 18 and are unsupported by the lower portion.

The upper portion 16 is made of a conductive material, such as a metal. An exemplary suitable metal is tungsten. Tungsten has the advantageous properties of blocking substantially all or a large portion of ions of a type and having an energy typically used to implant a semiconductor material such as silicon to produce a doped material with desired electrical conductivity. Thus, as described below, a tungsten upper portion may be used as an implant mask for the underlying semiconductor substrate. Further, tungsten has a high melting temperature, which allows it to endure high-temperature manufacturing processes such as annealing, for example, as described in greater detail below. It will be appreciated that other suitable metals may alternatively or in addition be used for the upper portion 16. For example, layers of different types of metals may be used, if desired. Alternatively, alloys or other combinations of suitable metals may be employed. Metals have the advantageous property of high electrical conductivity, which makes for lower resistance connections between the gate electrode 12 and other electrical components of the semiconductor device 10. However, it will be appreciated that suitable non-metallic materials may alternatively be employed in the upper portion 16 if desired.

The upper portion 16 has rounded bottom surfaces 24 which result from an etching process used in forming the T-shaped gate electrode 12. It will be appreciated that the upper portion 16 may alternatively have other shapes than the shape shown in FIG. 1.

The upper portion 16 may have a thickness of between 300 and 500 angstroms.

The lower portion 18 of the gate electrode 12 is also made of an electrically-conductive material. The conductive material of the lower portion may be a non-metallic material, such as a semiconductor material, for example polysilicon. The polysilicon may be pre-doped with N-type dopants for N-channel devices and/or P-type dopants for P-channel devices. An exemplary range of concentration of these dopants is between $1 \times 10^{20}$ and $2 \times 10^{20}$ atoms/cm³. The lower portion 18 may have a thickness of between 800 and 1,200 angstroms.

The gate electrode 12 includes a diffusion barrier 26 between the upper portion 16 and the lower portion 18. The diffusion barrier 26 prevents contamination of the semiconductor material of the lower portion 18 by the metal of the upper portion 16. An exemplary material for the diffusion barrier 26 is titanium nitride. The diffusion barrier 26 may have a thickness of between 50 and 150 angstroms.

A gate dielectric 28 is interposed between the lower portion 18 of the gate electrode 12 and a surface 30 of the semiconductor substrate 14. The gate dielectric 28 may be made of suitable typical gate dielectric materials, such as silicon dioxide ($SiO_2$), silicon oxynitride, or silicon nitride ($Si_3N_4$). An exemplary gate dielectric may have a thickness of between 15 and 30 angstroms.

The semiconductor substrate 14 has a source region 32, a drain region 34, and an intervening active region 36. The semiconductor substrate 14 may be made of typical, well-known semiconductor materials, for example silicon. The source region 32, the drain region 34, and the active region 36 may be regions of the semiconductor substrate 14 into which electrically-active impurities have been introduced. The source region 32 and the drain region 34 have different conductivity types than the active region 36, the source and drain regions being for example N-type silicon and the active region being for example P-type silicon. The source region 32 has a shallower source extension 40 in the vicinity of the gate dielectric 28. The drain region 24 similarly has a shallower drain extension 42 in the vicinity of the gate dielectric 28. A thin channel region 44 is along the surface of the substrate 14, under the gate dielectric 28 and between the source region 32 and the drain region 34. It will be appreciated that the source region 32, the drain region 34, the active region 36, the channel region 44, and the gate electrode 12 together form a metal oxide semiconductor field-effect transistor (MOSFET). The principles of operation of a MOSFET for inducing a conduction path between a source region and a drain region are well known.

The source region 32 has a source metal-semiconductor region 46 and the drain region 34 has a drain metal-semiconductor region 47. The metal-semiconductor regions 46 and 47 are along the surface 30 of the semiconductor substrate 14. They have the purpose of facilitating electrical connection of the respective source and drain regions 32 and 34 to suitable conductive materials, which are then used for connection to other parts of the semiconductor device 10 such as voltage sources. An exemplary material in the metal-semiconductor regions 46 and 47 is a silicide such as cobalt silicide.

The source region 32, the drain region 34, the active region 36, and the channel region 44, may be formed by implanting well-known electrically-active impurities into the semiconductor substrate 14. For instance, boron or indium may be implanted to form a channel for an N-type device and phosphorous or arsenic may be implanted to form a channel for a P-type device. The implantation to form the source region 32 and the drain region 34 is described in greater detail below. It will be appreciated that the active region 36 may be part of a larger region of electrically-active material in the semiconductor substrate 14.

Spacers 48 extend upward from the surface 30 of the substrate 14 on either side of the gate electrode 12. The spacers 48 extend substantially to the bottom portions 24 of the overhangs 20, thereby defining spacer-gate gaps 49 between the spacers 48 and the lower portion 18 of the gate electrode 12. The gaps 49 advantageously reduce gate-to-source and gate-to-drain capacitances.

The semiconductor substrate 14 includes insulator-filled isolation trenches 50 to electrically isolate individual electrical devices such as the MOSFET transistor described above.

It will be appreciated that suitable structural filler material may be used to structurally support the overhangs 20.

The T-shaped gate electrode 12 advantageously provides a relatively large upper surface 54 of the upper portion 16, when compared with the amount of the surface 30 of the semiconductor substrate 14 covered by the gate electrode 12. For example, the width of the lower portion 18 and the gate dielectric 28 may be less than or equal to 1,000 angstroms, while the width of the upper surface 54 may be greater than or equal to 2,000 angstroms. Thus the amount of area on the semiconductor substrate 14 taken up by the gate electrode 12 may be reduced, while electrical connection of the gate electrode 12 may continue to be relatively easy due to the relatively large upper surface 54. In addition, a metallic upper portion results in low electrical resistance through the gate electrode and through the contact between the gate electrode and subsequent conductive connects which may be electrically-connected to the upper surface 54.

Figure 2:
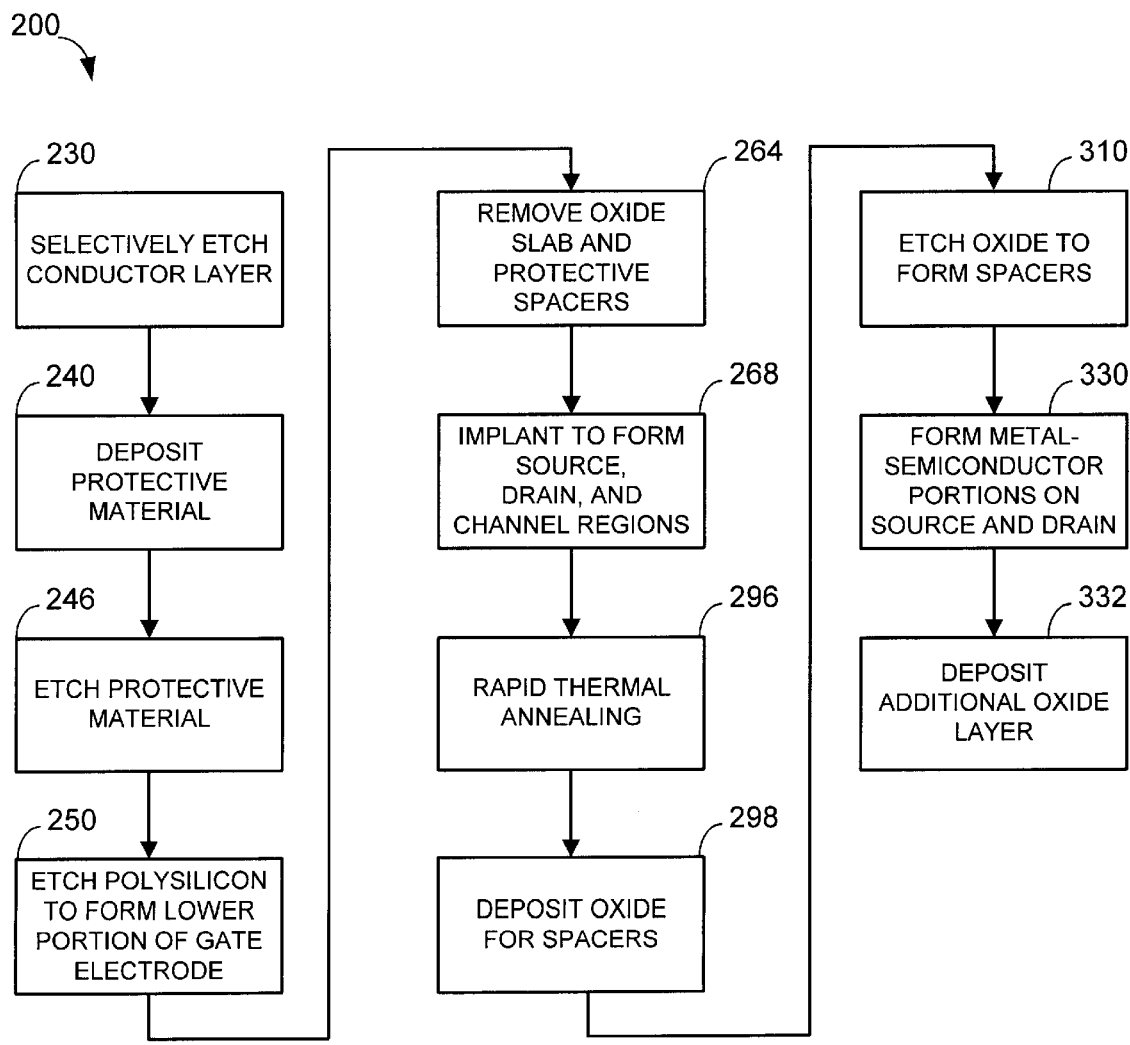
FIG. 2 is a flow chart illustrating a method for fabricating a semiconductor device embodying the present invention.

The steps of a method 200 for fabricating a semiconductor device 210 (which may be similar to the semiconductor device 10 described above) are outlined in the flow chart shown in FIG. 2. FIGS. 3–11 illustrate various steps of the method 200. It will be appreciated that the method 200 and the semiconductor device 210 described below are merely exemplary, and that suitable of the many above-described variations in materials, thicknesses, and/or structures may alternatively be used in the method 200 and/or the semiconductor device 210.

Figure 3:
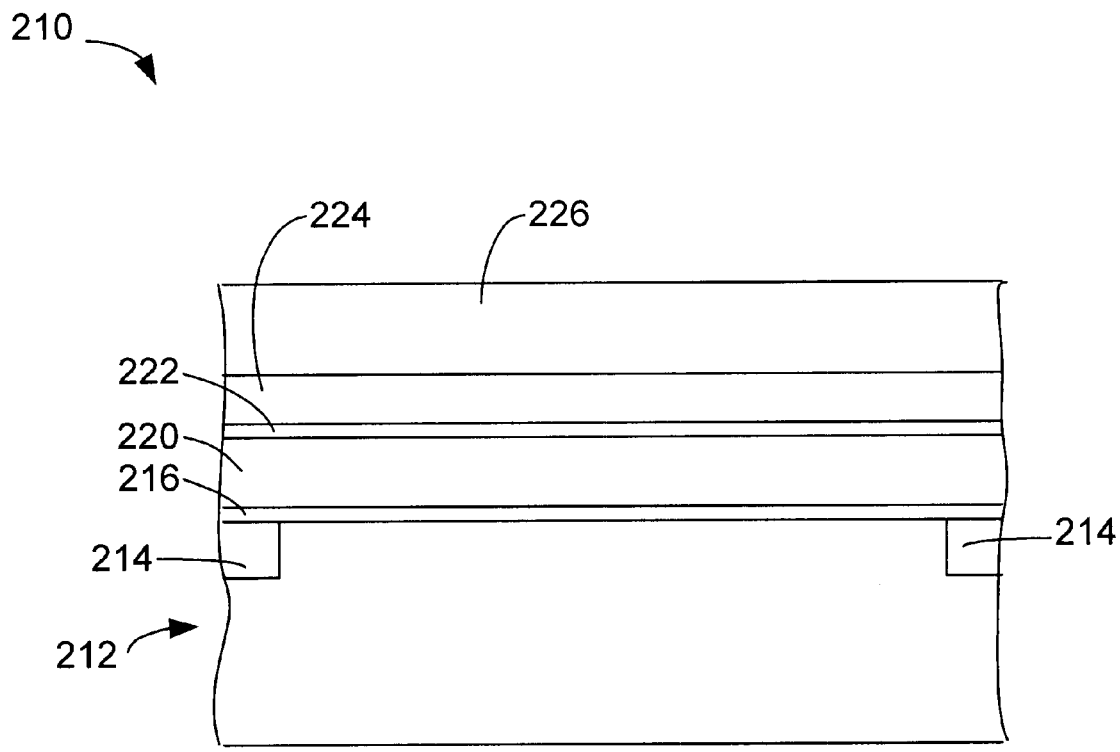
FIGS. 3–12 are illustrations of various steps of the method of FIG. 2.

The semiconductor device 210 is shown in FIG. 3 as a starting material for the processing steps of the method 200. The device 210 includes a semiconductor substrate 212 with insulator-filled isolation trenches 214 therein. A gate dielectric layer 216 is atop the substrate 212, with a conductor (polysilicon) layer 220, a diffusion barrier layer 222, a metal layer 224, and an oxide layer 226 atop the gate dielectric layer 216, in that order.

It will be appreciated that well-known methods may be used to form the starting material shown in FIG. 3. It will further be appreciated that the insulator-filled isolation trenches 214 may be formed in a later step in the method, rather than being formed as part of the starting material.

The semiconductor substrate 212 may be appropriately doped, as described above, to form a region or layer of electrically-active material for eventual use as an active region of the MOSFET to be formed.

The oxide layer 226 may be made of silicon dioxide or any of a variety of suitable materials for use in a later step to protect portions of the metal layer from an etchant. It will be understood that the use of the term "oxide" with regard to the oxide layer 226 or portions thereof, encompasses the variety of suitable well-known materials for protecting the metal.

Figure 4:
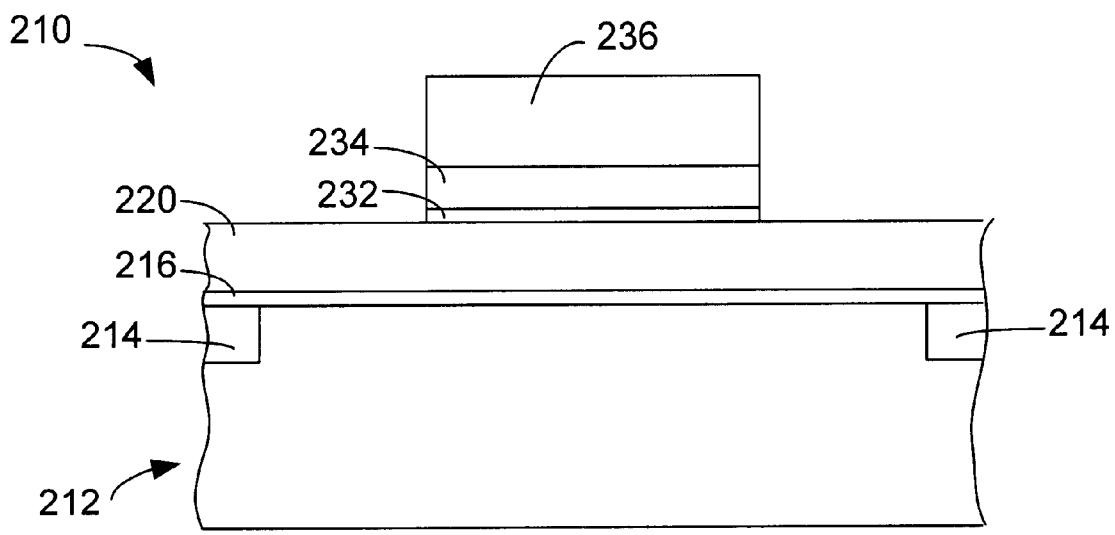

In step 230 of the method 200, an etch is performed down to the conductor layer 220. Thus portions of the diffusion barrier layer 222, the metal layer 224, and the oxide layer 226 are removed, thereby leaving a diffusion barrier 232, a metal slab 234, and an oxide slab 236, as shown in FIG. 4. The width of the metal slab 234 is based on the desired width of the metal top portion of the gate electrode being formed. It will be appreciated that suitable selective etching methods are well-known in the art. For example a mask may be placed on the semiconductor device 210 to protect portions of the underlying layers. Formation of the mask may involve depositing a photoresist on the semiconductor device, exposing portions of the photoresist such as by selective light exposure, and removing exposed or unexposed portions of the resist through use of a suitable solvent. A suitable etchant may thereafter be used to remove, as desired, unprotected portions of the diffusion barrier layer 222, the metal layer 224, and the oxide layer 226.

Figure 5:
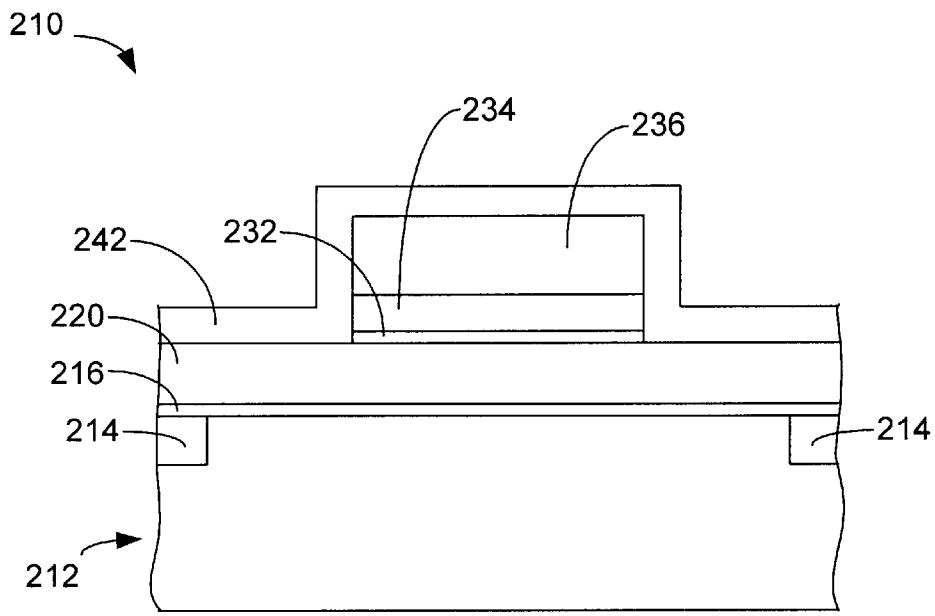
Figure 6:
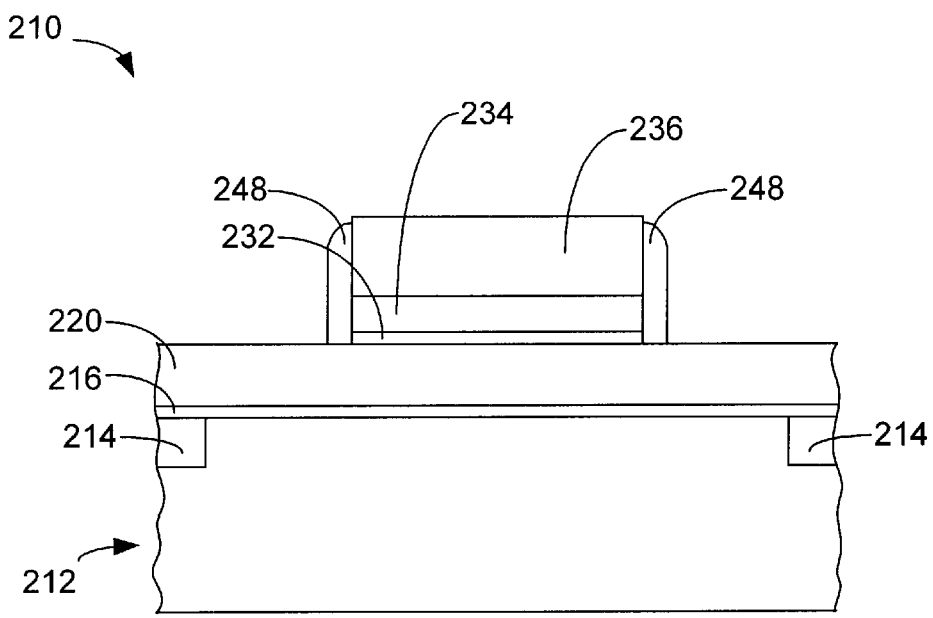

Thereafter, in step 240, a protective material 242 is deposited on the semiconductor device 210, as illustrated in FIG. 5. The protective material 242 is then anisotropically etched in step 246 to leave protective spacers 248 of the protective material, as illustrated in FIG. 6. A function of the protective spacers 248 is to protect sides of the metal slab 234 from etching during the etch of the conductive (polysilicon) layer 220, which is described below. In effect, the protective spacers 248 may serve as sacrificial material during the etch. An exemplary suitable protective material is silicon nitride, although it will be appreciated that other suitable materials may alternatively be used. The protective material 242 may have a thickness of between 100 and 150 angstroms.

Figure 7:
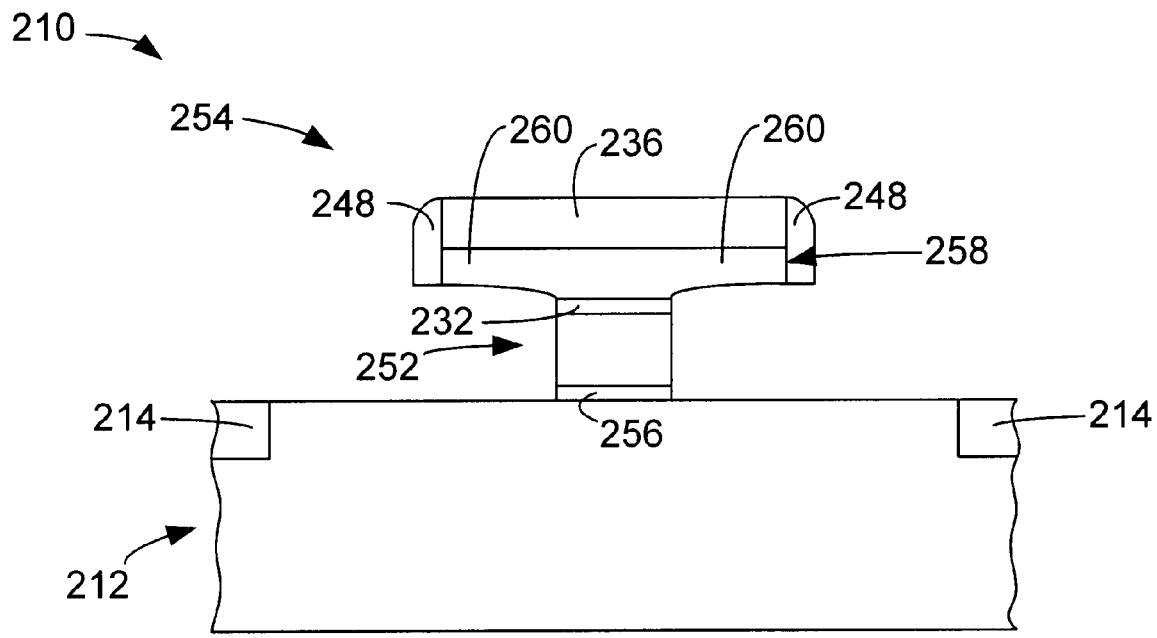

In step 250, illustrated in FIG. 7, an etch of the conductive polysilicon layer 220 is performed, leaving the structure shown in FIG. 7. Thus much of the conductive polysilicon layer 220 and the gate dielectric layer 216 are removed, leaving a conductive lower portion 252 of a gate electrode 254 and a gate dielectric 256 which have a smaller footprint than a remaining metal upper portion 258 of the metal slab 254. As a result, overhangs 260 of the metal upper portion 258 extend beyond and are not supported by the conductive lower portion 252.

The etching performed in step 250 may be done in two steps. First an etch using $SF_6$ chemistry may be performed to undercut the polysilicon layer 220. Thereafter an etch utilizing chlorine (Cl) chemistry may be done to smooth the walls of the conductive lower portion 252.

Figure 8:
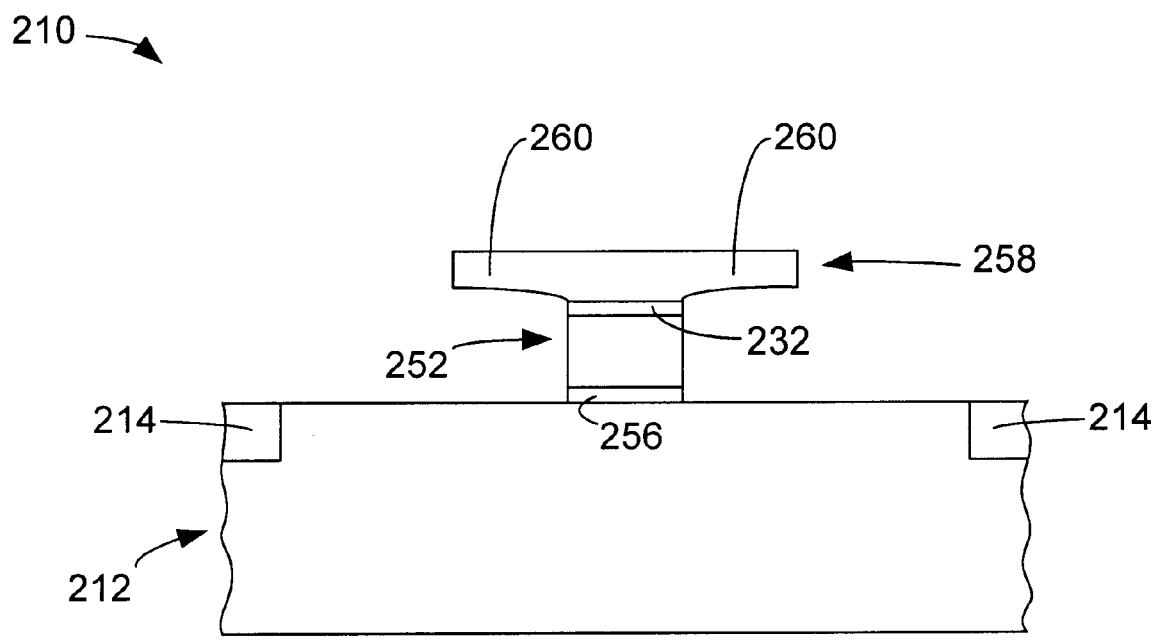

Thereafter the remainder of the oxide slab 236 and the protective spacers 248 are removed in step 264 by use of well-known suitable techniques. The resulting structure is illustrated in FIG. 8.

Figure 9:
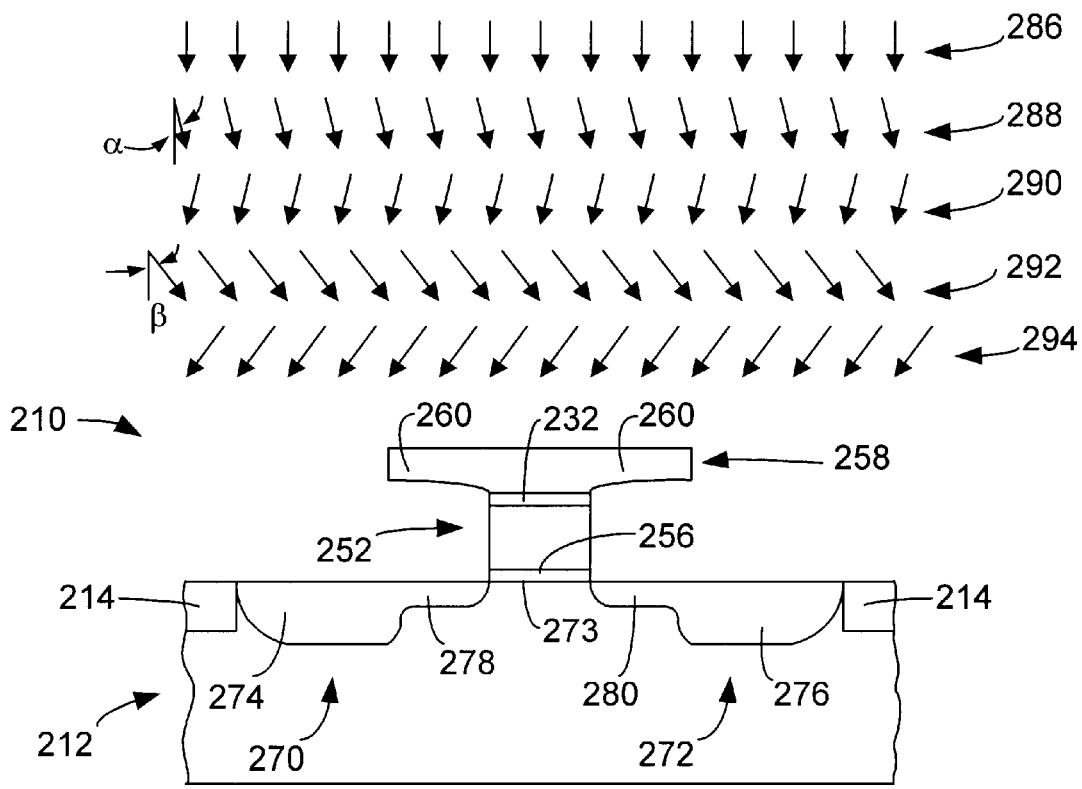
Figure 10:
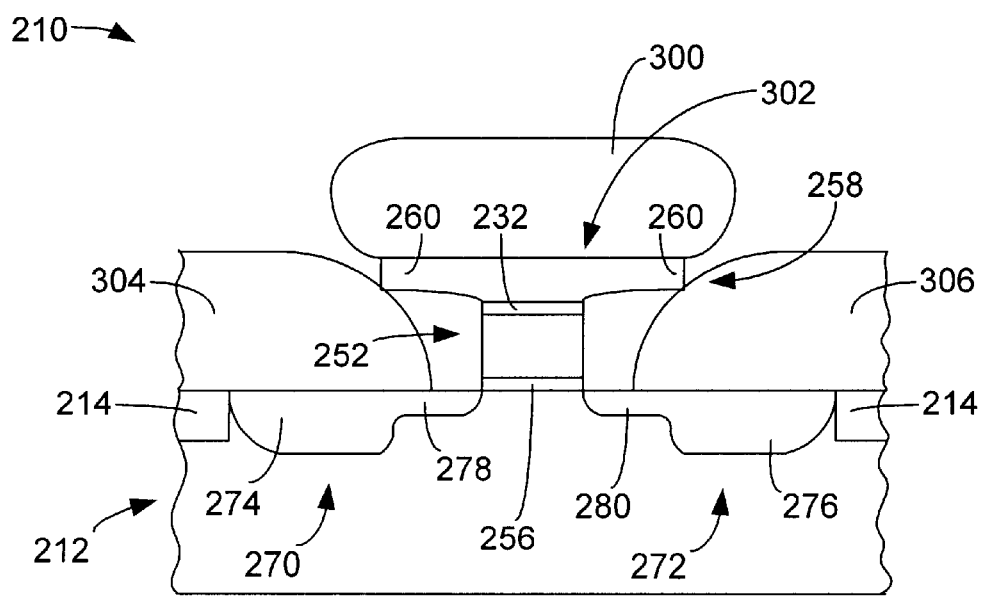
Figure 11:
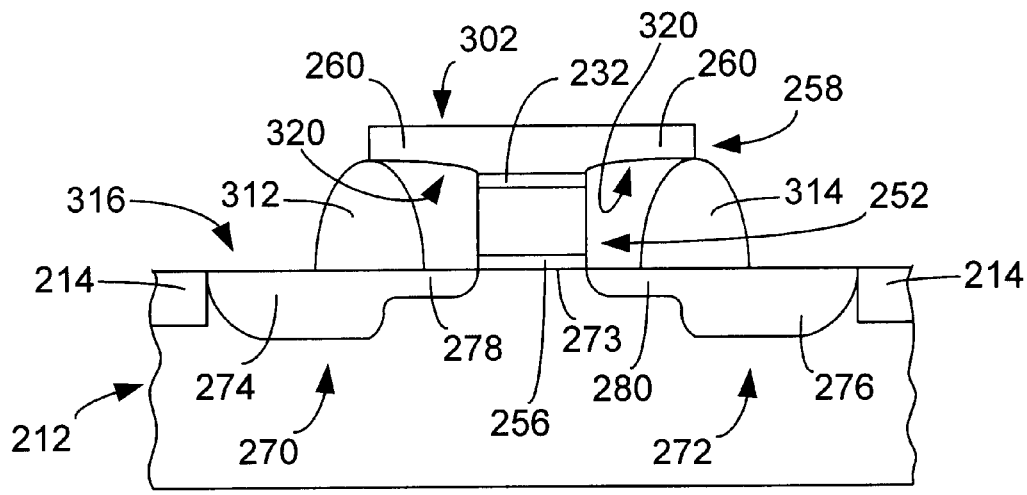

FIG. 9 illustrates the implanting of regions of the semiconductor substrate 212 which are performed in step 268. The implants produce a source region 270 and a drain region 272 in the substrate 212, as well as a channel region 273 underneath the gate dielectric 256, between the source region 270 and the drain region 272. The source and drain regions 270 and 272 have respective source and drain deep implant regions 274 and 276, as well as respective source and drain extensions 278 and 280. The source and drain regions may be formed by a combination of implants, such as a perpendicular implant 286 and extension implants 288 and 290. Exemplary ions for the implants 286, 288, and 290 are $BF_2$ and arsenic. The perpendicular implant 286 is a relatively high energy, high concentration implant which is capable of producing the source and drain deep implant regions 274 and 276. An exemplary range of concentrations for the perpendicular implant 286 is between $2\times10^{15}$ and $4\times10^5$ atoms/cm$^2$. The metal upper portion 258 of the gate electrode 254 acts as an implant mask during the perpendicular implant 286, thereby preventing doping of the conductive lower portion 252 and the portion of the substrate 212 which underlies the overhangs 260. The source and drain extensions 278 and 280 are formed in the semiconductor substrate 212 by the respective extension implants 288 and 290. The extension implants 288 and 290 are tilted at an extension tilt angle a from the perpendicular, thus allowing the implanted material to reach under the overhangs 260 to form the source and drain extensions 278 and 280. The extension tilt angle a may be between approximately 10° and 20°. The total concentration of the extension implants 288 and 290 may be, for example, between $2\times10^{14}$ atoms/cm$^3$ and $7\times10^{14}$ atoms/cm$^3$. The extension implants 288 and 290 may be of the same material as the perpendicular implant 286, or may alternatively include different materials. It will be appreciated that the extension implants 288 and 290 may have the same extension tilt angle (albeit with different direction) and may be of the same material and the same concentration. However, it will be appreciated that the extension implants 288 and 290 may be different from one another, if so desired.

The channel region 273 is formed by tilted channel implantation (TCI), in tilted channel implants 292 and 294. Suitable ions for such the tilted channel implants 292 and 294 are listed above, and concentrations and energies for such implants are well known in the art. For example, a boron implant may have an energy of between 20 and 30 keV. A phosphorous ion implant may have an energy of between 40 and 75 keV. The total concentration of the channel implants 292 and 294 may be, for example, from $4\times10^3$ atoms/cm$^2$ to $6\times10^3$ atoms/cm$^2$. A TCI angle β for the tilted channel implants 292 and 294 may be between 30° and 45°.

Although the extension implantation and the tilted channel implantation are illustrated as each involving two implants, it will be appreciated that a greater number of implants may be employed, with the extension implantation utilizing, for example, four rotations, and the tilted channel implantation utilizing, for example, four or eight rotations.

After implantation, the semiconductor device 210 is subjected to rapid thermal annealing (RTA) in step 296. Exemplary RTA may be performed for between five and fifteen seconds at a temperature of 1,020–1,050° C. A spacer material such as an oxide material, for example silicon dioxide, is then deposited on the substrate 210 in step 298, illustrated in FIG. 10. The deposition produces an upper portion oxide overlay 300 upon a top surface 302 of the metal upper portion 258. The oxide deposition also produces substrate oxide layers 304 and 306 upon the semiconductor 212. The oxide deposition may be performed, for example, by plasma enhanced chemical vapor deposition (PECVD).

In step 310 the oxide is etched with a suitable etchant. The upper portion oxide overlayer 300 is thereby substantially removed, and the substrate oxide layers 304 and 306 are reduced in size, leaving the oxide spacers 312 and 314 shown in FIG. 11. It will be appreciated that the oxide spacers 312 and 314 are protected from etching due to the presence of the metal upper portion 258. The oxide spacers 312 and 314 may extend from a surface 316 of the semiconductor substrate 212 substantially to bottom overhang surfaces 320 of the overhangs 260.

Figure 12:
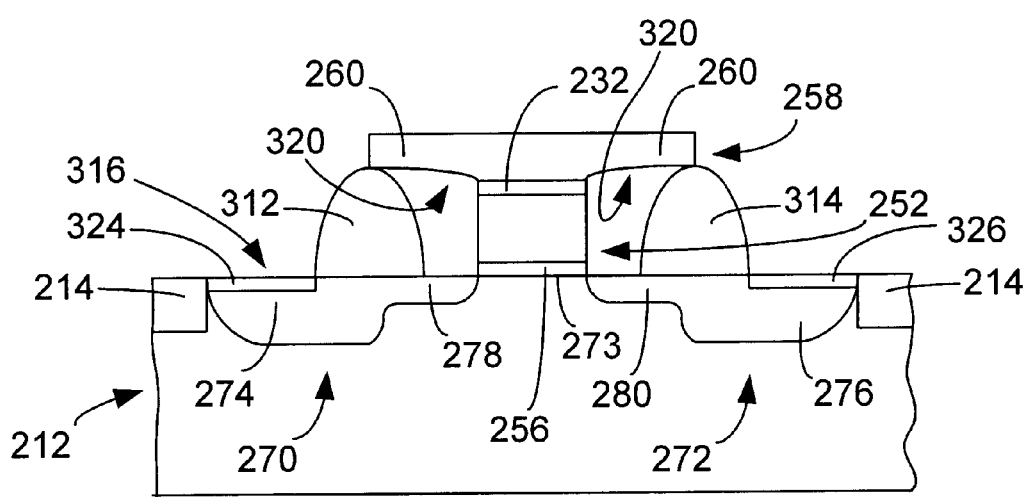

Respective source and drain metal-semiconductor portions 324 and 326 are formed in step 330 as part of the source and drain regions 270 and 272, as shown in FIG. 12. The metal-semiconductor regions 324 and 326 may be formed by depositing a metal, for example cobalt, on the semiconductor device 210, and then by annealing the semiconductor device to form a semiconductor-metal compound, such as cobalt silicide.

Thereafter an additional layer of oxide may be deposited in step 332 to cover the gate. Openings may be made in the additional layer of oxide to allow electrical connection to be made with the source and drain regions, and with the gate electrode. Conventional well-known methods may be utilized to deposit the additional layer of oxide and make openings therethrough.

It will be appreciated that many alternative sequences or steps may be used to accomplish the implantation. For example, the extension implants 288 and 290 may be performed before the perpendicular implant 286. The semiconductor devices 10 and 210 described above may have other materials and devices formed upon them by conventional, well-known methods and means.

What follows now are alternative embodiment devices and methods of the invention. Some of the similar features between the following devices and methods and those described above are omitted herein for the sake of brevity. It will be appreciated that various of the features of the multiple embodiments described herein may be combined where suitable with features of other embodiments.

Figure 13:
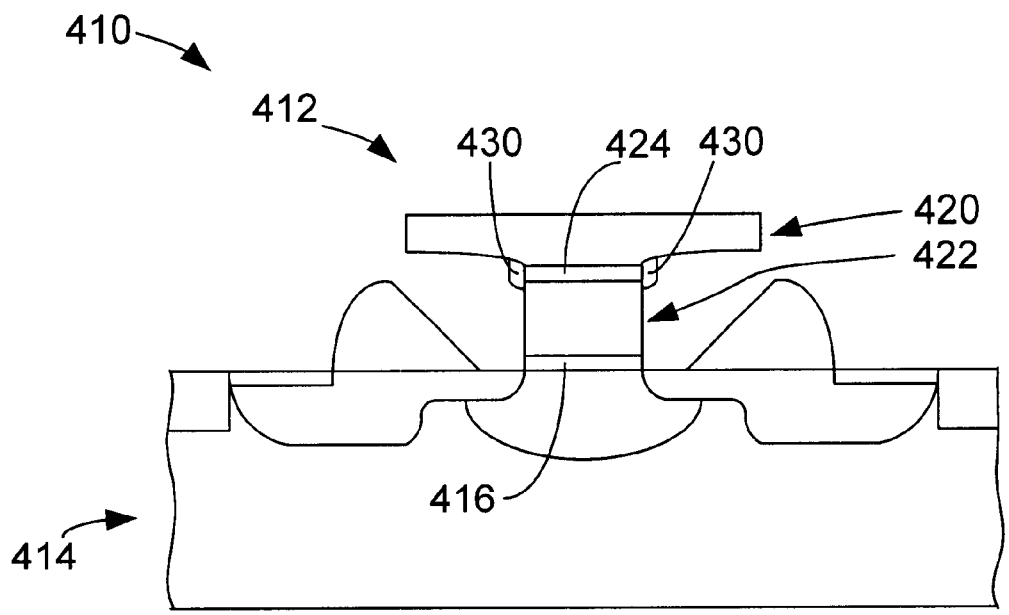
FIG. 13 is a side sectional view of an alternate embodiment semiconductor device embodying the present invention.

Referring now to FIG. 13, a semiconductor device 410 has a T-shaped gate electrode 412 on a semiconductor substrate 414, with a gate dielectric 416 therebetween. The gate electrode 412 has a metal upper portion 420, for example a tungsten upper portion. A semiconductor lower portion 422 is also part of the gate electrode 412. A diffusion barrier 424 is between the metal upper portion 420 and the semiconductor lower portion 422. The gate electrode 412 also has metal-semiconductor portions 430 which are electrically coupled to both the metal upper portion 420 and the semiconductor lower portion 422. The metal-semiconductor portions 430 aid electrical conductivity between the semiconductor lower portion 422 and the metal upper portion 420. An exemplary material for the metal-semiconductor portion is a cobalt-semiconductor compound such as cobalt silicide.

It will be understood that the semiconductor device 410 may have increased electrical conductivity and correspondingly lower resistance when compared with the semiconductor devices 10 and 210 described above.

Figure 14:
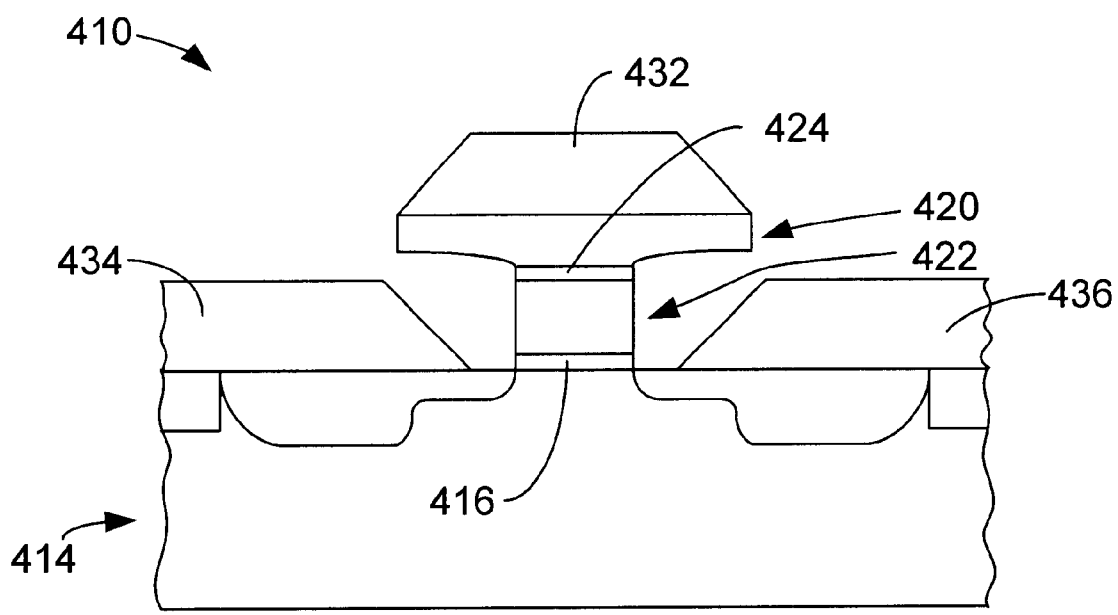
FIGS. 14–16 are side sectional views illustrating various steps in the fabrication of the semiconductor device of FIG. 13.
Figure 15:
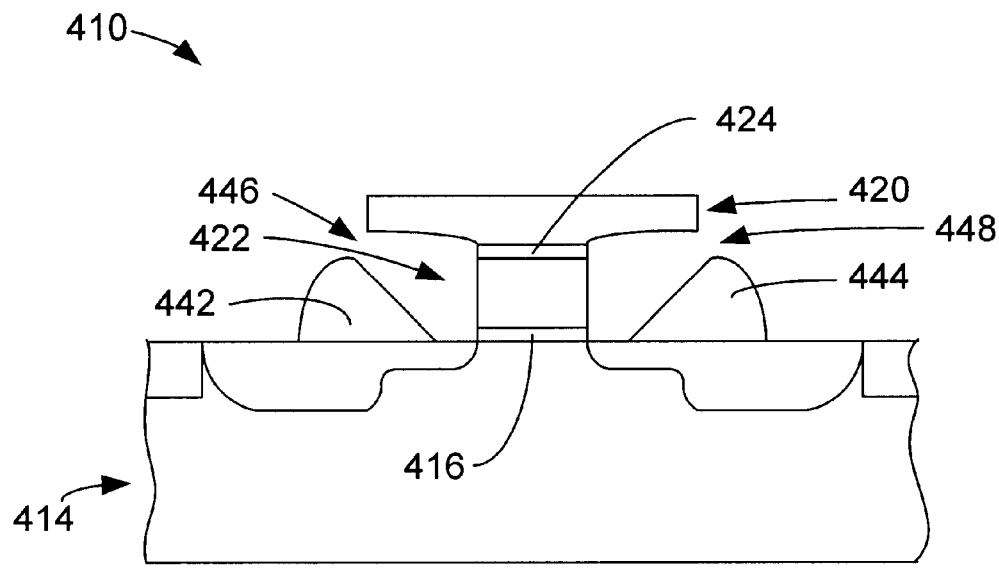
Figure 16:
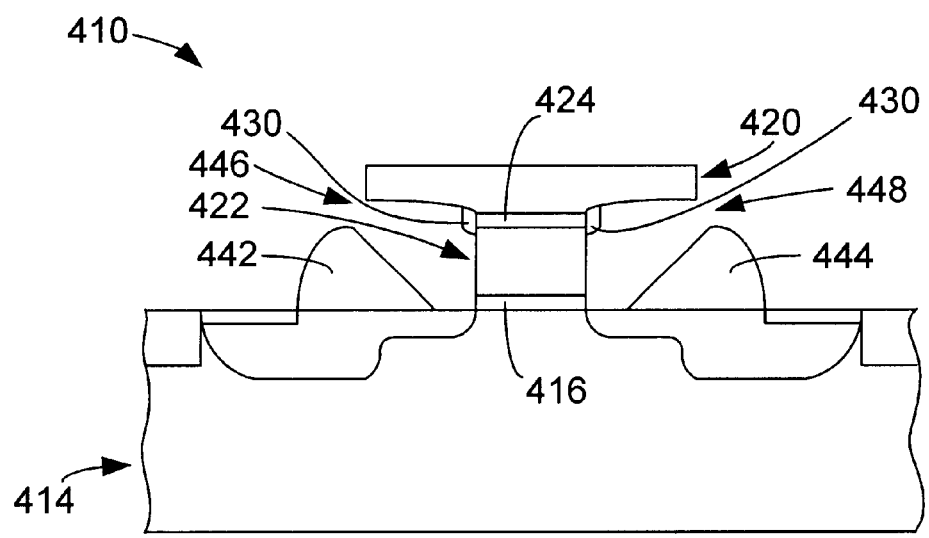

FIGS. 14–16 illustrate some of the steps in the fabrication of the semiconductor device 410, highlighting the differences between the fabrication of the semiconductor device 410 and that of the above-described semiconductor device 210, which does not have gate metal-semiconductor portions.

FIG. 14 illustrates the deposition of oxide on the semiconductor device 410 to produce an upper portion oxide overlayer 432 on the metal upper portion 420, and substrate oxide layers 434 and 436 on the semiconductor substrate 414. The substrate oxide layers 434 and 436 do not fill substantially the gap between the semiconductor substrate 414 and overhangs 440 of the metal upper layer 420. The deposition illustrated in FIG. 14 may for example be accomplished using well-known electron cyclotron resonance chemical vapor deposition (ECR CVD) methods. This step is analogous to the step 298 of the method 200.

When etching of the oxide is accomplished in a step analogous to the step 310 of the method 200, oxide spacers 442 and 444 are formed. The oxide spacers 442 and 444 leave respective spacer-overhang air gaps 446 and 448 between the spacers and the overhangs 440 of the metal upper portion 420.

As illustrated in FIG. 16 in a step to form metal-semiconductor compounds on the semiconductor substrate 414, analogous to the step 330, some of the deposited metal passes through the air gaps 446 and 448 to contact the semiconductor lower portion 422 and the metal upper portion 420 of the gate electrode 412. Upon annealing, the gate metal-semiconductor portions 430 are formed.

It will be appreciated that other suitable means for forming oxide spacers with air gaps may alternatively be employed. Further, it will be appreciated that other suitable methods may alternatively be employed to deposit metal on the gate electrode to form gate metal-semiconductor portions.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method for fabricating a semiconductor device, comprising:
    forming a T-shaped gate electrode over a semiconductor substrate, the gate electrode having a metal upper portion which overhangs a semiconductor lower portion; and
    selectively implanting an exposed surface of the substrate, using the metal upper portion as an implant mask;
    wherein the forming the T-shaped gate electrode includes:
        depositing a layer of semiconductor material over a gate dielectric which is on top of the substrate;
        depositing a diffusion barrier material over the semiconductor material;
        depositing a metal layer on the diffusion barrier material;
        selectively removing material to form the gate electrode having the metal upper portion overhanging the semiconductor lower portion, with the diffusion barrier therebetween; and
        selectively etching the metal layer to leave remaining portions of the metal layer;
        forming protective material on the remaining portions; and
        selectively etching the semiconductor material.

2. The method of claim 1, wherein the forming the protective material includes depositing an oxide layer on the metal layer prior to the selectively etching the metal layer, and depositing a nitride spacer on exposed sides of the remaining portions of the metal layer after the selectively etching the metal layer.

3. A method for fabricating a semiconductor device, comprising:
    forming a T-shaped gate electrode over a semiconductor substrate, the gate electrode having a metal upper portion which overhangs a semiconductive lower portion; and
    selectively implanting an exposed surface of the substrate, using the metal upper portion as an implant mask; and
    tilted channel implanting to from a channel region:
    wherein the selectively implanting includes multiple implanting of the exposed surface to form source and drain implanted regions having respective source and drain extension regions, and wherein the multiple implanting includes tilted extension implanting of the exposed surface to form the extension regions.

4. The method of claim 3, wherein the tilted implanting includes implanting at an angle between 10 degrees and 20 degrees.

5. The method of claim 3, wherein the conductive lower portion of the gate electrode is a semiconductor lower portion.

6. A method for fabricating a semiconductor device, comprising:
    forming a T-shaped gate electrode over a silicon substrate, the gate electrode having a metal upper portion which overhangs a semiconductive lower portion;
    selectively implanting an exposed surface of the substrate, using the metal upper portion as an implant mask;
    forming oxide spacers on the exposed surface wherein the forming the oxide spacers includes:
    depositing oxide upon the exposed surface and upon the metal upper portion of the gate electrode, and
    etching the oxide; and
    silicidizing a portion of the exposed surface not covered by the oxide spacers.

7. The method of claim 6, wherein the depositing oxide includes plasma enhanced chemical vapor deposition of the oxide.

8. The method of claim 6, wherein the forming oxide spacers includes forming silicon oxide spacers.

9. The method of claim 8, wherein the silicidizing includes depositing cobalt.

10. The method claim 6, wherein the conductive lower portion of the gate electrode is a semiconductor lower portion.

11. A method for fabricating a semiconductor device, comprising:
    forming a T-shaped gate electrode over a silicon substrate, the gate electrode having a metal upper portion which overhangs a conductive lower portion;
    selectively implanting an exposed surface of the substrate, using the metal upper portion as an implant mask;
    forming oxide spacers on the exposed;
    silicidizing a portion of the exposed surface not covered by the oxide spacers; and
    wherein the conductive lower portion of the gate electrode is a silicon lower portion and the forming the oxide spacers includes forming the oxide spacers such that the oxide spacers prevent silicidation of the silicon lower portion.

12. A method of fabricating a semiconductor device, comprising:
    forming a gate electrode over a semiconductor substrate, the gate electrode having a metal upper portion and a semiconductor lower portion; and
    forming a suicide on the gate electrode which is electrically coupled to the lower portion and the upper portion.

13. The method of claim 12, wherein the forming a silicide includes forming a cobalt silicide.

14. The method of claim 12, wherein the gate electrode is a T-shaped gate electrode with overhangs of the upper portion overhanging the lower portion, and the forming the metal-semiconductor portion includes forming oxide spacers on the substrate, the oxide spacers being at least partially underneath the overhangs, with air gaps between the oxide spacers and the overhangs and depositing metal on the lower portion via the air gaps, and heating the device to create the metal-semiconductor portion.

15. The method of claim 14, wherein the depositing metal includes depositing cobalt.

16. The method of claim 14, wherein the lower portion is a silicon lower portion and the depositing metal and the heating cause silicidification of at least part of the lower portion.

17. The method of claim 14, wherein the forming the oxide spacers includes depositing oxide on the substrate and the upper portion, and etching the oxide, using the upper portion as an etch mask.

18. The method of claim 17, wherein the depositing includes electron cyclotron resonance chemical vapor deposition.

19. The method of claim 12, wherein the forming the gate electrode includes forming a T-shaped gate electrode.

20. The method of claim 12, wherein the forming the gate electrode includes forming a diffusion barrier between the upper portion and the lower portion.

21. The method of claim 20, wherein the forming the silicide includes forming the silicide on a sidewall of the electrode, spanning the diffusion barrier.

22. A method of Fabricating a semiconductor device, comprising:

forming a gate electrode over a semiconductor substrate, the gate electrode having a metal upper portion and a semiconductor lower portion wherein the forming the gate electrode includes forming a diffusion barrier between the upper portion and the lower portion; and forming a metal-semiconductor portion on a sidewall of the gate electrode which is electrically coupled to the lower portion and the upper portion.

23. The method of claim 17, wherein the forming the gate electrode includes forming a tungsten upper portion.

24. The method of claim 22, wherein the forming the gate electrode includes forming a T-shaped gate electrode.

* * * * *

UNITED STATES PATENT AND TRADEMARK OFFICE
CERTIFICATE OF CORRECTION

PATENT NO. : 6,596,598 B1
DATED : July 22, 2003
INVENTOR(S) : Krivokapic et al.

It is certified that error appears in the above-identified patent and that said Letters Patent is hereby corrected as shown below:

Column 1,
Line 10, replace "MOSFETS" with -- MOSFETs --.

Column 6,
Lines 63 and 66, replace "a" with -- $\alpha$ --.

Column 9,
Line 31, replace "semiconductor" with -- conductive --.

Signed and Sealed this

Twenty-eighth Day of October, 2003

JAMES E. ROGAN
*Director of the United States Patent and Trademark Office*